US012216153B2

United States Patent
Li et al.

(10) Patent No.: US 12,216,153 B2
(45) Date of Patent: Feb. 4, 2025

(54) SEMICONDUCTOR PRODUCT WITH EDGE INTEGRITY DETECTION STRUCTURE

(71) Applicant: Avago Technologies International Sales Pte. Limited, Singapore (SG)

(72) Inventors: Xiaoming Li, Newport Beach, CA (US); Liming Tsau, Irvine, CA (US); Andy Brotman, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 17/700,186

(22) Filed: Mar. 21, 2022

(65) Prior Publication Data

US 2023/0296664 A1    Sep. 21, 2023

(51) Int. Cl.
  *G01R 31/28*    (2006.01)
  *H01L 23/58*    (2006.01)

(52) U.S. Cl.
  CPC ..... *G01R 31/2858* (2013.01); *G01R 31/2896* (2013.01); *H01L 23/585* (2013.01)

(58) Field of Classification Search
  None
  See application file for complete search history.

(56) References Cited

U.S. PATENT DOCUMENTS

| 9,741,667 B2 | 8/2017 | Zeng et al. |
| 2003/0024731 A1* | 2/2003 | Nordal ............... H01L 24/82 174/250 |
| 2006/0055007 A1 | 3/2006 | Yao et al. |
| 2008/0203388 A1 | 8/2008 | He et al. |
| 2009/0201043 A1* | 8/2009 | Kaltalioglu ......... H01L 23/585 324/762.05 |
| 2014/0124889 A1 | 5/2014 | Qian et al. |
| 2016/0300800 A1* | 10/2016 | Zeng .................. H01L 22/34 |
| 2018/0145002 A1* | 5/2018 | Munder ............... H01L 23/66 |
| 2019/0250208 A1* | 8/2019 | Dhanasekaran ... G01R 31/2858 |

* cited by examiner

Primary Examiner — Nasima Monsur
(74) Attorney, Agent, or Firm — Foley & Lardner LLP (57) ABSTRACT

A semiconductor product, which comprises a semiconductor chip, an edge integrity detection structure extending along at least part of an edge of the semiconductor chip, and evaluation circuitry formed in and/or on the semiconductor chip, being electrically connected with the edge integrity detection structure, and being configured to evaluate an electric characteristic of the edge integrity detection structure to provide an evaluation signal indicative of a detected edge integrity status of the edge.

20 Claims, 6 Drawing Sheets

SEMICONDUCTOR PRODUCT WITH EDGE INTEGRITY DETECTION STRUCTURE

FIELD OF THE DISCLOSURE

This disclosure generally relates to semiconductor products.

BACKGROUND OF THE DISCLOSURE

Die edge delamination or cracking can result in reliability problems and yield loss. Die edge delamination or cracking can occur during the dicing of the wafer, and can be exacerbated by the introduction of ICs with low-k dielectrics in 65 nm technology node, and beyond. The use of a low-k dielectric reduces the interconnect coupling capacitance, but also reduces mechanical strength and adhesion. Die edge delamination and cracking become even more severe when using laser grooving in the dicing process, where edge chipping can be reduced at the cost of increased thermal damage to the die edges. For example, using a laser to cut the wafer at high temperatures can cause metal to oxidize and form an enlarged metal oxidized layer. The metal oxidization can enlarge the volume of metal layer, for example, at the edges of the die. This enlarged metal oxidized layer loses strength and can peal or crack. The crack can further enter into the chip and can cause a device failure.

BRIEF DESCRIPTION OF THE DRAWINGS

Various objects, aspects, features, and advantages of the disclosure will become more apparent and better understood by referring to the detailed description taken in conjunction with the accompanying drawings. In the drawings, like reference numbers generally indicate identical, functionally similar, and/or structurally similar elements.

The details of various embodiments of the methods and systems are set forth in the accompanying drawings and the description below.

DETAILED DESCRIPTION

Below are detailed descriptions of various concepts related to, and embodiments of, techniques, approaches, methods, apparatuses, and systems for edge integrity detection. The various concepts introduced above and discussed in detail below can be implemented in any of numerous ways, as the described concepts are not limited to any particular manner of implementation. Examples of specific embodiments and applications are provided primarily for illustrative purposes.

Integrated circuits with edge assurance structures have been provided. The edge assurance structure can be located around an edge of the integrated circuit. The edge assurance structure can include a plurality of V-shaped structures that are connected to each other using a plurality of ultra-thick vias. The integrated circuit can include a pad that is coupled to the edge assurance structure. The pad can be used to measure a resistance of the edge assurance structure.

In some embodiments, a semiconductor product is provided which includes a semiconductor chip or substrate, an integrated circuit (IC) formed in and/or on the semiconductor chip, an edge integrity detection structure extending along at least part of an edge of the semiconductor chip, and evaluation circuitry formed in and/or on the semiconductor chip. The circuitry is electrically connected with the edge integrity detection structure, and is configured for evaluating an electric characteristic of the edge integrity detection structure for providing an evaluation signal indicative of a detected edge integrity status of the edge. In some embodiments, the use of the edge integrity detection structure reduces time for monitoring devices for delamination and other defects, such as, by visual inspection and/or time-consuming and inefficient manual probing.

In some embodiments, a semiconductor product includes a semiconductor chip, an integrated circuit formed in and/or on the semiconductor chip, and an edge integrity detection structure extending along at least part of an edge of the semiconductor chip. The edge integrity detection structure includes electrically connected, planar, electrically conductive layer structures. Each of at least three (e.g., each of at least five) of the electrically conductive layer structures overlaps at least partially (e.g., overlaps substantially completely) with each other of the at least three (e.g., at least five) electrically conductive layer structures in a planar view.

In still another embodiment, a semiconductor product includes a semiconductor chip, an integrated circuit formed in and/or on the semiconductor chip, and an edge integrity detection structure extending along at least part of an edge of the semiconductor chip. The edge integrity detection structure includes parallel planar electrically conductive layer structures being substantially in alignment with each other in a plan view and being connected with each other by electrically conductive vertical connection elements.

In the context of the present application, a "semiconductor product" may, for example, comprise a physical body, component or member, or even a device made of two or more different elements, being manufactured partially or entirely in semiconductor technology. For instance, the semiconductor product may comprise one or more semiconductor chips, in particular a naked or molded die. Also systems on a chip (SoC), modules, chiplets or other electronic devices comprising one or a number of semiconductor chips may be denoted as semiconductor product. Semiconductor products may be manufactured for example in group IV semiconductor technology (for instance in silicon technology) or in group III-V semiconductor technology (for example in gallium arsenide technology).

In the context of the present application, the term "semiconductor chip" may denote for example a substrate comprising a semiconductor material, such as silicon, and including integrated electric circuitry. For instance, a semiconductor chip may be a naked die or an encapsulated die. A semiconductor chip may be produced by singularizing a wafer (initially comprising a plurality of still integrally connected semiconductor chips) into individual semiconductor chips. Singulation of a semiconductor chip from a wafer compound may be accomplished, for example, by sawing, dicing, or laser cutting.

In the context of the present application, the term "integrated circuit" or IC may denote for example a number of interconnected integrated circuit elements manufactured at least partially by semiconductor processing technology. For example, such integrated circuit elements may include at least one of a transistor, a diode, a resistor, a conductive trace, a contacts, a via, a capacitor, an inductor, etc. The integrated circuit elements forming the integrated circuit can be monolithically integrated in the semiconductor chip. Hence, an integrated circuit can be a monolithically integrated circuit.

In the context of the present application, the term "edge integrity detection structure" may denote for example an electrically conductive physical structure positioned and/or structurally configured for detecting information indicating whether or not an edge along or around a semiconductor chip is intact or not (for instance is broken). In particular, edge integrity may be impacted by separating a semiconductor chip from a wafer by cutting or sawing along an edge of each semiconductor chip. For example, an edge of a semiconductor chip may break or delaminate during a singulation process. The edge integrity detection structure may be located along the edge or part thereof so as to be impacted by an edge separation process which causes damage of the edge. The edge integrity detection structure may act as a damage probe for detecting an edge integrity deteriorating event.

In the context of the present application, the term "planar electrically conductive layer structures" may denote for example flat patterned or structured metal layers. Each of the layer structures may extend within a horizontal plane. Different layer structures may be located in different planes, the planes being parallel to each other. The layer structures may form part of a common layer stack.

In the context of the present application, the term "electrically conductive layer structures overlapping at least partially with each other in a plan view" may denote for example an arrangement of the electrically conductive layer structures related to a vertical viewing direction onto a main surface of the semiconductor chip. A main surface of a semiconductor chip a top surface when the chip is attached to a package substrate or the largest surface in area of the chip in some embodiments. In such a viewing direction, the mentioned electrically conductive layer structures may have at least portions in common which portions overlay each other in the plan view. In some embodiments, the electrically conductive layer structures may overlap entirely so as to have a common outline in the mentioned vertical viewing direction.

In the context of the present application, the term "each of at least three electrically conductive layer structures overlaps at least partially with each other of the at least three electrically conductive layer structures in a plan view" may denote for example that, when traversing the electrically conductive layer structures along a vertical direction corresponding to the plan view (the vertical direction being perpendicular to the planes in which the layer structures extend), all the at least three electrically conductive layer structures are crossed.

In the context of the present application, the term "electrically conductive layer structures being substantially in alignment with each other in a plan view" may denote for example an arrangement of the electrically conductive layer structures related to a vertical viewing direction. In such a viewing direction onto a main surface of the semiconductor chip, the mentioned electrically conductive layer structures may overlay each other essentially entirely. An exception (and in particular the only exception) of a complete overlay may be tiny gaps between different sections of the respective electrically conductive layer structure. Such tiny gaps may be the result of a patterning or structuring of a respective electrically conductive layer structure. Apart from such tiny gaps, the electrically conductive layer structures may all have a common outline within which all electrically conductive layer structures may extend substantially continuously. Descriptively speaking, parallel electrically conductive layer structures being substantially in alignment with each other in a plan view may form a common wall with substantially full metal coverage in each electrically conductive layer structure of the wall. The electrically conductive layer structures of the edge integrity detection structure may be parallel metal stripes shaped as open rectangle (see for example FIG. 1).

In the context of the present application, the term "electrically conductive vertical connection elements" may denote for example metallic structures extending perpendicular to the parallel planar electrically layer structures, so that each vertical connection element interconnects or bridges vertically at least two of the layer structures extending in different parallel planes. For example, the electrically conductive vertical connection elements may be metallic vias, metallic pillars, etc.

In the context of the present application, the term "evaluation circuitry" may denote for example circuitry configured for evaluating electric signals of an edge integrity detection structure for determining information about edge integrity. For example, such evaluation circuitry may comprise hardware elements. For instance, the evaluation circuitry may be hard-wired. However, it is also possible that the evaluation circuitry comprises software elements (for instance including firmware). The evaluation circuitry may be on-chip, for example may be monolithically integrated in the semiconductor chip of the semiconductor product.

In the context of the present application, the term "evaluation signal indicative of a detected edge integrity status of the edge" may denote for example an electric signal which carries information characterizing integrity or non-integrity of an edge of the semiconductor chip. For example, the edge integrity status may indicate that integrity of the edge can be confirmed or that the edge shows non-integrity. Hence, the edge integrity status may indicate the status in a digital way, for instance by a logical value "1" or "0". It is also possible that more than two different edge integrity states may be distinguished, for instance full integrity, no integrity, limited but still acceptable integrity, and limited but no more acceptable integrity. Alternatively, the edge integrity status may be indicated by a gradual value, for instance by an analog value. The evaluation signal may be an on-chip signal.

Generally, some embodiments of a first aspect provide semiconductor products having an edge integrity detection structure with multiple mutually overlapping interconnected planar electrically conductive layer structures. In some embodiments, such interconnected electrically conductive layer structures may be aligned with each other so that they have a common identical outline in a top view. The electrically conductive layer structures may constitute an aligned electrically conductive network or framework along an exterior edge of the semiconductor chip. When the edge of the semiconductor chip is damaged, in particular during separating the semiconductor chip from a semiconductor wafer, integrity of the edge integrity detection structure may be intentionally damaged. For example, an electric connection of constituents of the edge integrity detection structure may be damaged in the occurrence of phenomena such as breakage or delamination at the edge of the semiconductor chip or a surrounding seal ring. An evaluation of the electric characteristics of the edge integrity detection structure may then allow derivation of information concerning an edge integrity status of the chip edge. Advantageously, the construction of the edge integrity detection structure from three or more interconnected planar electrically conductive layer structures in different parallel planes all overlapping with all others partially or substantially completely in a plan view may create a quasi-continuous electrically conductive wall constituting an elongate two-dimensional resistor chain. Such a structure may be highly sensitive to any kind of damage at an edge around the semiconductor chip. In particular, constructing the edge integrity detection structure from multiple interconnected planar electrically conductive layer structures being almost completely in alignment with each other in a plan view may allow to form a quasi-continuous grid-type edge damage probe being intentionally prone to damage when the edge around the semiconductor chip is damaged. A quasi-continuous electrically conductive network of interconnected layer structures may be highly sensitive with regard to substantially any kind of edge damage so that false outputs erroneously confirming edge integrity may be reliably prevented.

Moreover, some embodiments of a second aspect provide a semiconductor chip with edge integrity detection structure (for example of the above mentioned kind or of another kind) extending along an exterior edge of an integrated circuit of the semiconductor chip and having an on-chip evaluation circuitry. In some embodiments, the evaluation circuitry may form part of the same semiconductor chip which also includes the edge integrity detection structure. Thus, an evaluation signal indicating a detected edge integrity status characterizing integrity or non-integrity of the semiconductor chip edge may be created by and on the semiconductor chip itself. In some embodiments, electric paths are kept short, thereby ensuring a high quality of the evaluation signal. Moreover, providing an on-chip evaluation circuitry electrically connected with an edge integrity detection structure may allow generation of an on-chip evaluation signal for indicating the detected edge integrity status. This evaluation signal may be read out during a chip test process. In some embodiments, large pads can be provided for a further processing of the evaluation signal apart from the chip. Processing of the evaluation signal apart from the chip allows a more compact semiconductor chip in some embodiments.

Some embodiments may provide an easily manufacturable and powerful chip edge damage monitor and simple test methods. Some embodiments of systems and methods discussed herein allow a chip edge damage (e.g., a seal ring damage) to be determined with low effort and high reliability before the chip is transferred to an application.

In some embodiments, at least 80%, and preferably at least 90%, of a main surface of each of the electrically conductive layer structures is in alignment with at least 80%, (e.g., at least 90%) of a main surface of each of the other electrically conductive layer structures. Thus, the vast majority of the metal area of the overlapping electrically conductive layer structures may be in alignment. Hence, a substantially homogeneous metal network composed of vertically spaced parallel patterned metal layers and interconnecting vertical connection elements in between may be created. This has the advantage that substantially any edge damaging event may be reliably detected by the edge integrity detection structure in some embodiments.

In some embodiments, the semiconductor product comprises electrically conductive vertical connection elements, such as metallic vias, connecting the electrically conductive layer structures with each other. The electrically conductive vertical connection elements may be grouped into a number of groups, wherein electrically conductive vertical connection elements of a respective group may be in alignment with each other in a planar view. Hence, the electrically conductive layer structures are aligned, and the vertical connection elements are aligned in some embodiments. For instance, sequences of aligned stacked vias may be formed.

In some embodiments, the edge integrity detection structure is configured so that at least part of the electrically conductive layer structures are disconnected from each other in the event of a breakage at the edge of the semiconductor chip. Additionally or alternatively, the edge integrity detection structure may be configured so that at least part of the electrically conductive layer structures and the electrically conductive vertical connection elements are disconnected from each other in the event of a delamination at the edge of the semiconductor chip. For example, breakage at the edge of the semiconductor chip may occur upon dicing. Breakage may include phenomena such as cracking and chipping. Breakage at a chip edge may lead to an intended interruption of the interconnection between the electrically conductive layer structures of the edge integrity detection structure. Another artifact which may occur at a chip edge during processing may be delamination, i.e. an unintentional separation of different layers. Also such a phenomenon may be detected by a change of the electric properties of the edge integrity detection structure, since delamination may disconnect a respective layer structure from an assigned vertical connection element.

In some embodiments, the electrically conductive layer structures and the electrically conductive vertical connection elements form a meander structure. Some embodiments are shown for instance in FIG. 3 and FIG. 4. A meander structure may provide an elongate resistor path or chain with small space consumption. Thus, the provision of a meander structure may combine a high detection sensitivity with a compact design.

In some embodiments, the electrically conductive layer structures and the electrically conductive vertical connection elements additionally form a further meander structure. Advantageously, the meander structure and the further meander structure may be electrically connected with each other (see for instance FIG. 3). As a result, the electrically conductive path formed by the edge integrity detection structure may be further prolonged for further improving the detection accuracy while keeping the design compact.

Figure 3:
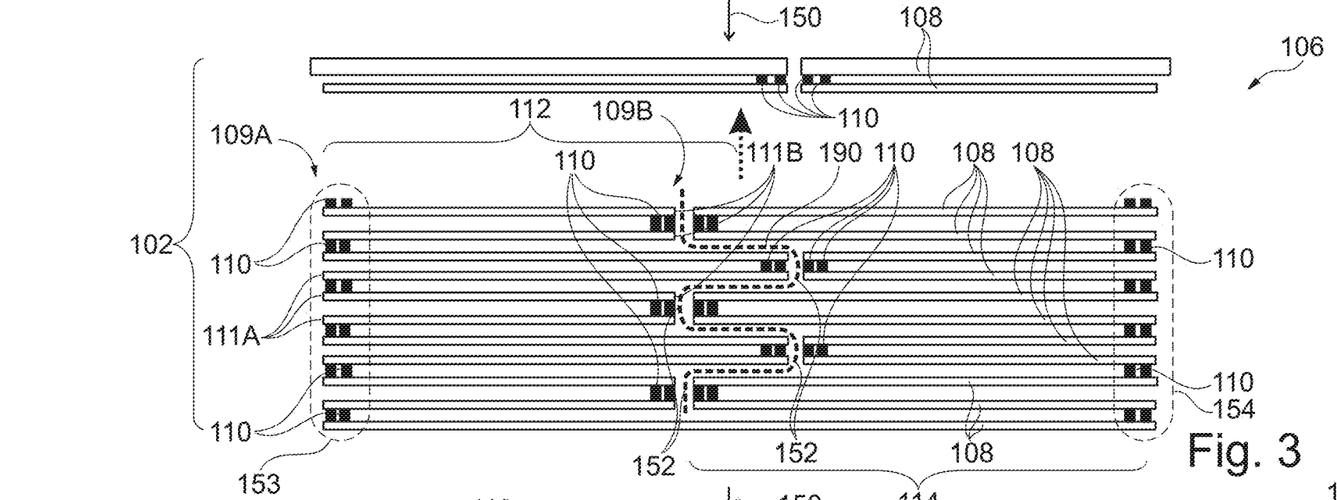
FIG. 3 illustrates a cross-sectional view schematic drawing of an edge integrity detection structure of a semiconductor product according to some embodiments.

In some embodiments, the meander structure and the further meander structure are interleaved (see for instance also FIG. 3). This may further reduce the space consumption of the edge integrity detection structure. Furthermore, interleaved meander structures may reduce dead volumes in which an edge damage event might not be detectable.

In some embodiments, the semiconductor product comprises another meander structure arranged side-by-side with the meander structure and with the further meander structure. Such an embodiment is shown for instance in FIG. 4. A number of meander structures may be arranged next to each other along the edge of the semiconductor chip. This may expand the region in which edge damage of the semiconductor chip will lead to a detectable signal.

In some embodiments, the edge integrity detection structure surrounds at least 90% of the perimeter of the integrated circuit. The edge integrity detection structure may be substantially annular with an open end defining two terminals in some embodiments. Such a two terminal configuration may be advantageous for a resistance-based detection of edge integrity information. An almost closed ring-shaped geometry of the edge integrity detection structure may allow to spatially extend the detection sensitivity substantially around the entire outline of the semiconductor chip in some embodiments.

In some embodiments, the semiconductor product includes a seal ring surrounding the integrated circuit partially or entirely. For instance, a seal ring may be one continuous loop. Such a seal ring may be for example an annular closed metallic structure extending around the entire perimeter of the semiconductor chip for protecting the chip against chipping and cracking. The seal ring may form part of the semiconductor chip or may be formed separately around the semiconductor chip. While the seal ring may protect the semiconductor chip from damage along its edge, the edge integrity detection structure may detect an event of edge damage.

In some embodiments, at least part of the edge integrity detection structure is integrated in the seal ring. The edge integrity detection structure may be located inside of the seal ring. This may lead to a compact chip design. Furthermore, such a positioning of the edge integrity detection structure may provide meaningful detection results specifically at a location where edge damage will likely occur.

In some embodiments, at least part of the edge integrity detection structure is arranged inside of the seal ring. In such a configuration, the edge integrity detection structure may be located between the seal ring and the integrated circuit. In still another embodiment, at least part of the edge integrity detection structure is arranged outside of the seal ring. In some embodiments, the seal ring may be located between the edge integrity detection structure and the integrated circuit.

In some embodiments, the edge integrity detection structure is configured as a two terminal resistor chain. A first open end and a second open end of the edge integrity detection structure may be electrically coupled with each other by the electric resistance created by the electrically conductive layer structures and the vertical connection elements of the edge integrity detection structure, when intact. When the electrically conductive edge integrity detection structure is however not intact due to a damage of the semiconductor chip edge, an electrically conductive connection along the electrically conductive layer structures and the vertical connection elements will be interrupted so that the first open end and the second open end will be electrically decoupled from each other. Such a difference of the resistance of the edge integrity detection structure, when configured as two terminal resistor chain, between an intact and a damaged state may be detected electrically. In some embodiments, the two terminal resistor chain is connected between a lower supply voltage terminal (such as a ground terminal) and a sense terminal.

In some embodiments, the evaluation circuitry is electrically connected or connectable with the edge integrity detection structure, and is configured for evaluating a resistance of the edge integrity detection structure for providing an evaluation signal indicative of a detected edge integrity status of the edge. The evaluation may measure the ohmic resistance of the edge integrity detection structure and may use the results of this measurement to derive information about the integrity status of the semiconductor chip or a seal ring around the semiconductor chip. For example, a measured low ohmic resistance may indicate that the edge integrity detection structure and hence the edge of the semiconductor chip are intact. In contrast to this, a measured high ohmic resistance may indicate that the edge integrity detection structure is interrupted and hence the edge of the semiconductor chip is damaged.

In some embodiments, the evaluation circuitry is monolithically integrated in the semiconductor chip. Thus, the evaluation circuitry may be created by integrated circuit elements formed in and/or on the semiconductor chip. In particular, the evaluation circuitry may form part of the integrated circuit of the semiconductor chip. This may lead to a small space consumption and may thereby contribute to a miniaturization of the semiconductor chip.

In some embodiments, the evaluation circuitry is electrically connected with the edge integrity detection structure by a connection structure which is buried within the semiconductor chip and extends below the edge integrity detection structure. In some embodiments, the semiconductor product may comprise a seal ring surrounding the integrated circuit and having at least part of the edge integrity detection structure integrated therein. In some embodiments, the semiconductor product may comprise a buried connection structure extending in the semiconductor chip beneath the seal ring and beneath the edge integrity detection structure and electrically connecting the edge integrity detection structure with the evaluation circuitry. The edge integrity detection structure can electrically connect to the evaluation circuitry by an electrically conductive connection line which extends deeper into the semiconductor substrate of the semiconductor chip than a seal ring located at least partially between edge integrity detection structure and evaluation circuitry. An electric signal is transferred from the edge integrity detection structure to the evaluation circuitry via a connection line which is buried deep inside of the semiconductor substrate in some embodiments. By taking this measure, a short signal path may be obtained. At the same time, any undesired interaction between a transmitted electric signal and a seal ring may be reliably prevented. In some embodiments, the connection structure may be realized as a deep well connection.

In some embodiments, the evaluation circuitry is configured for evaluating a resistance of the edge integrity detection structure as basis for the evaluation signal. In some embodiments, the evaluation circuitry may be configured for evaluating the resistance by detecting a current flowing through the edge integrity detection structure. In some embodiments, a zero current may be indicative of a defective detected edge integrity status, and a non-zero current may be indicative of an intact detected edge integrity status.

In some embodiments, the evaluation circuitry forms part of and/or is electrically connected with the integrated circuit. A chip external evaluation circuitry may then be dispensable.

In some embodiments, the evaluation circuitry is arranged at an edge of the integrated circuit neighboring to at least part of a seal ring, thereby keeping the electric path between edge integrity detection structure and evaluation circuitry short. In some embodiments, the integrated circuit allows the provision of functionality of the semiconductor product in a central region of the semiconductor chip which may be free of the evaluation circuitry.

In some embodiments, the evaluation circuitry is configured for providing a logic evaluation signal indicative of the detected edge integrity status. A logic evaluation signal may have at least two, preferably exactly two, different states for indicating the detected edge integrity status. For instance, a logic value "0" may indicate that the semiconductor chip edge is intact, whereas a logic value "1" may indicate that the semiconductor chip edge is damaged. For example, the logic evaluation signal may be a digital signal. A digital output may be less prone to distortions and may therefore be highly reliable.

In some embodiments, the evaluation circuitry includes an analog block for detecting information indicative of a resistance of the edge integrity detection structure. In some embodiments, the evaluation circuitry may be configured for providing a digital evaluation signal indicative of the detected edge integrity status. The evaluation circuitry may have an analog input and a digital output. This may improve reliability of the output signal in terms of indicating an integrity status of the chip edge.

In some embodiments, the digital evaluation signal is a one-bit signal. Advantageously, a single bit may allow to indicate the edge integrity status as "intact" (corresponding to a first logic value of the one-bit signal, such as "0") or "damaged" (corresponding to a second logic value of the one-bit signal, such as "1"). Such a one-bit signal indicating a chip edge integrity status may be integrated perfectly into a chip test, such as a self-test. Thus, the evaluation circuitry may be configured for providing the evaluation signal in the framework of a semiconductor product test procedure.

Provision of pads at the semiconductor product for probing an evaluation signal by an external probe may be advantageously dispensable. This may have a positive impact on the compactness of the semiconductor chip. In some embodiments, the semiconductor product includes an electric output interface (such as a pad) configured for providing the evaluation signal to an external automatic test equipment.

In some embodiments, the evaluation circuitry includes a reference resistance structure having a higher resistance value than the edge integrity detection structure in an intact state of the edge integrity detection structure, and comparator circuitry configured for comparing a signal indicative of the resistance value of the edge integrity detection structure with a signal indicative of the resistance value of the reference resistance structure so that the evaluation signal is provided as an output of the comparator circuitry. In some embodiments, the comparator architecture may allow a reliable evaluation signal to be provided efficiently and robustly. In some embodiments, the evaluation circuitry includes bias circuitry for electrically biasing the edge integrity detection structure and the reference resistance structure. In some embodiments, bias circuitry may apply an electric voltage to the edge integrity detection structure and the reference resistance structure.

Low-k dielectric materials may be susceptible to cracking and chipping during wafer dicing at a die edge. Such artifacts at an edge may leave latent damage to the obtained semiconductor chip. An affected chip may pass a final test, but may nevertheless fail during later use in view of broken metal connections or the like.

Efforts have been put into this area to detect and screen out damaged parts before they are actually used for fulfilling a dedicated function. However, conventional solutions may require mandatory chip pads and/or a significant extra chip area for a detection structure and associated protection structures.

In order to overcome the above-mentioned and/or other conventional shortcomings, some embodiments may place an edge integrity detection structure in a seal ring structure, so that no active chip area needs to be consumed for edge integrity detection. An evaluation circuitry, which may be embodied as core logic block, may convert a detected signal indicative of a resistance value of the edge integrity detection structure to logic levels that can be incorporated into a chip's built-in test or other self-test procedure. Some embodiments may provide an edge integrity detection structure configured as a seal ring monitor, wherein an evaluation signal indicative of an edge integrity status of the chip may be provided based on a detection signal by an on-chip evaluation circuitry.

In some embodiments, an edge integrity detection structure, (e.g., a continuous metal-via chain) is placed in a seal ring structure to detect any cracking and delamination. Cracking may lead to a broken metal line, whereas delamination may result in a broken via connection. Hence, different types of damage at a chip edge can be detected based on a resulting breakage of the metal-via chain. In some embodiments, an undamaged or intact metal-via chain may indicate that there is no die edge damage due to wafer dicing. A broken metal-via chain may lead to a higher resistance compared to an intact one. The latter may be pre-known or may be calculated from the geometry (in particular the length) of the resistor chain. An analog circuit block of the evaluation circuitry may convert a detected resistance change to a first logic level (for example having a logic value "1") if the resistor chain is broken and to another second logic level (for instance having a logic value "0") if the resistor chain is intact.

According to some embodiments, the edge integrity detection structure may be electrically connected to the evaluation circuitry by an electrically conductive chain detection connection line which may be embedded in a semiconductor substrate of the semiconductor chip, which may run for example beneath a seal ring. Such an electrically conductive chain detection connection line may be embodied advantageously as NWELL and/or DeepNWell. Such an architecture can electrically couple the edge integrity detection structure with the evaluation circuitry without breaking seal ring metal when the resistor chain is inserted in the seal ring. Such a buried connection may preserve the integrity of the seal ring metal layers.

Figure 4:
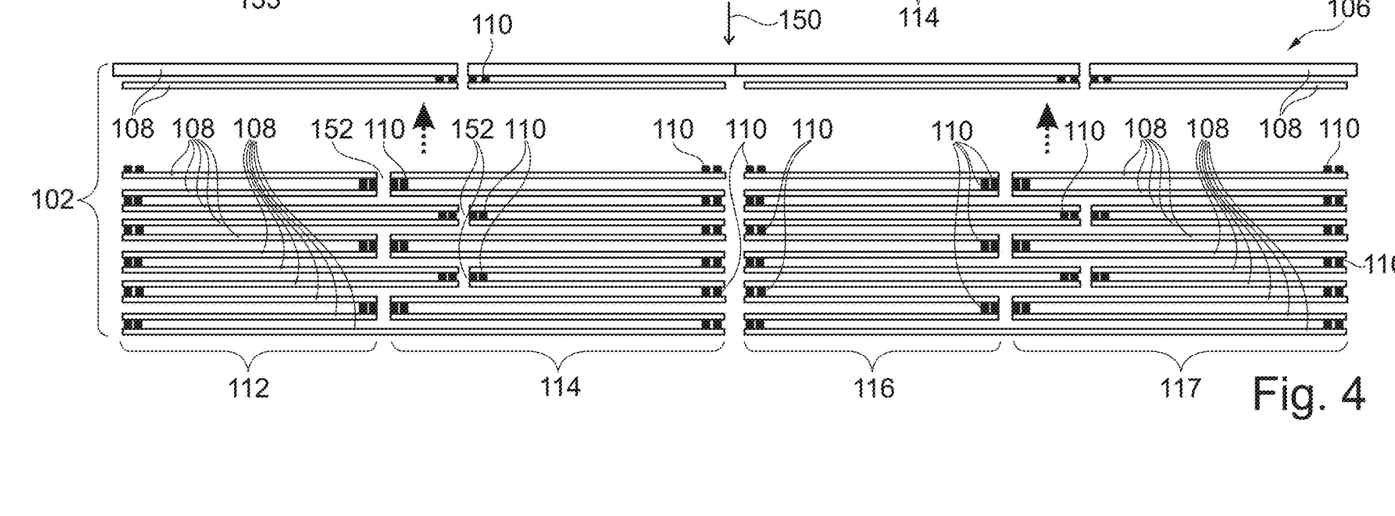
FIG. 4 illustrates a cross-sectional view schematic drawing of an edge integrity detection structure of a semiconductor product according to some embodiments.

According to some embodiments, a metal-via detection chain layout may be configured with parallel, aligned and substantially continuous metal layers to ensure both a high die edge cracking detection rate and a high delamination detection rate. In some embodiments, such a design (examples are shown in FIG. 3 and FIG. 4) may ensure that the vast majority of failing events at a chip edge can be in fact identified by the edge integrity detection structure.

Exemplary applications of exemplary embodiments are, for example, silicon chip products using a low-k dielectric or the like, in particular in a back end of line process.

In some embodiments, it may be possible to widen a seal ring by the size of the edge damage monitor metal-via chain width and related spacing. This may allow to satisfy potential seal ring design rule requirements.

In some embodiments, it may be possible to arrange the edge damage monitor chain inside the chip area next to the seal ring.

Many different embodiments of evaluation circuitries are possible for converting a detected chain resistance to a logic output signal. One corresponding embodiment of evaluation circuitry may include a bias circuit to bias the chain resistor of the edge integrity detection structure and a dummy resistor (e.g., implemented as polysilicon region in the semiconductor chip) that has a higher resistance than the metal-via chain resistance, in particular beyond a normal process variation. A comparator circuit may then be used to compare the voltage on the two resistors. If the edge damage monitor chain is broken, then its resistance may be much higher than the resistance of the dummy resistor, so that a comparator output may switch to indicate an edge damaged chip.

Advantageously, exemplary embodiments may provide a buried connection structure for electrically connecting an edge integrity detection structure with an on-chip evaluation circuitry. For example, such a buried connection structure may be embodied as a buried well connection to the detection metal-via chain. Advantageously, this may preserve seal ring integrity.

According to some embodiments, a small on chip analog circuit may be provided to convert a chain resistance detection into a core logic signal so that it can be used in a semiconductor chip's scan test, such as a Built In Self-Test (BIST), or any other self-test. Advantageously, a dedicated input/output pad and associated protection circuitry can be provided.

In some embodiments the edge damage monitor chain may be part of a seal ring. This may have the advantage that no extra chip area is required for the metal-via chain. A corresponding detection chain of such an edge integrity detection structure may be manufactured with low effort.

In some embodiments, it may be advantageous to configure the metal and via connection of an edge integrity detection structure and its location for achieving a high coverage of possible cracking damages. This can be achieved for example by a configuration according to FIG. 3 or FIG. 4. For example, this may be achieved by configuring the edge integrity detection structure with nearly 100% die edge side wall coverage. A corresponding layout of the detection chain may also allow to detect a delamination which may lead to an open via, and thus to a significant increase of the resistance of the edge integrity detection structure which can be detected by an evaluation circuitry. In some embodiments, evaluation circuitry includes an analog block for detecting the chain resistance. In some embodiments, the evaluation circuitry is configured for outputting a one-bit digital signal to the main chip. Such a failure robust one-bit digital signal may indicate whether or not the semiconductor chip edge is intact in some embodiments. A core logic implementation structure may be tested on an ATE (automatic test equipment) or on another tester.

Figure 1:
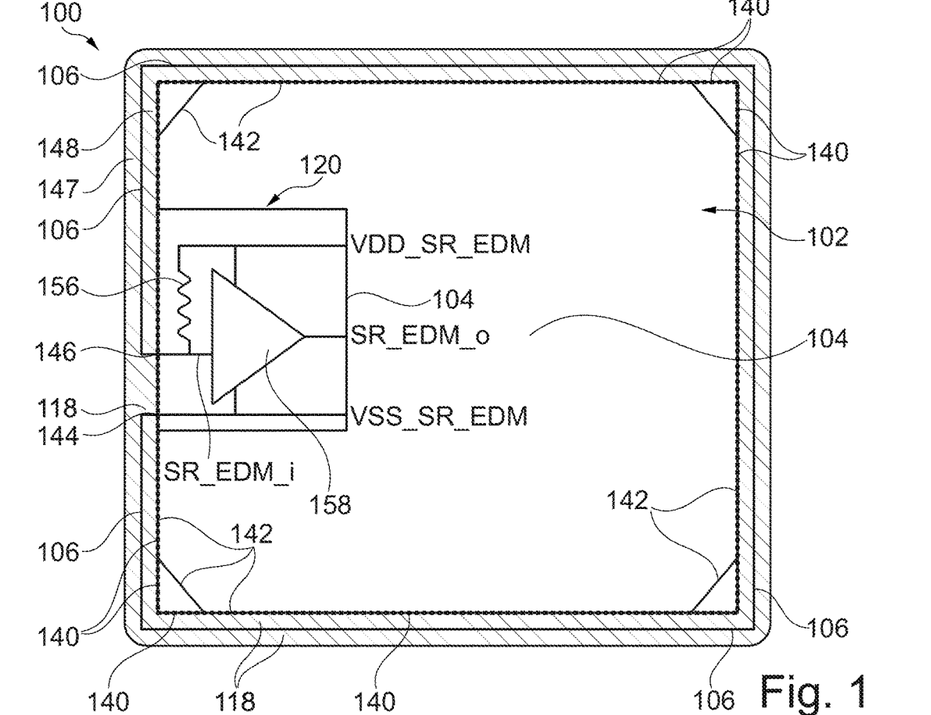
FIG. 1 illustrates a planar view schematic drawing of a semiconductor product according to some embodiments.
Figure 2:
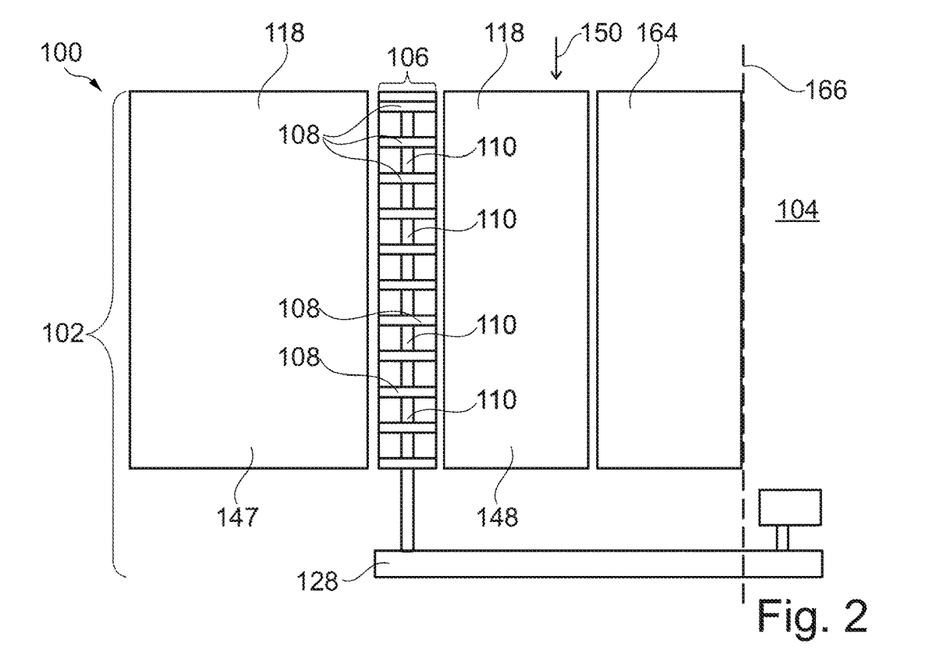
FIG. 2 illustrates a cross-sectional view schematic drawing of a portion of a semiconductor product according to some embodiments.
Figure 5:
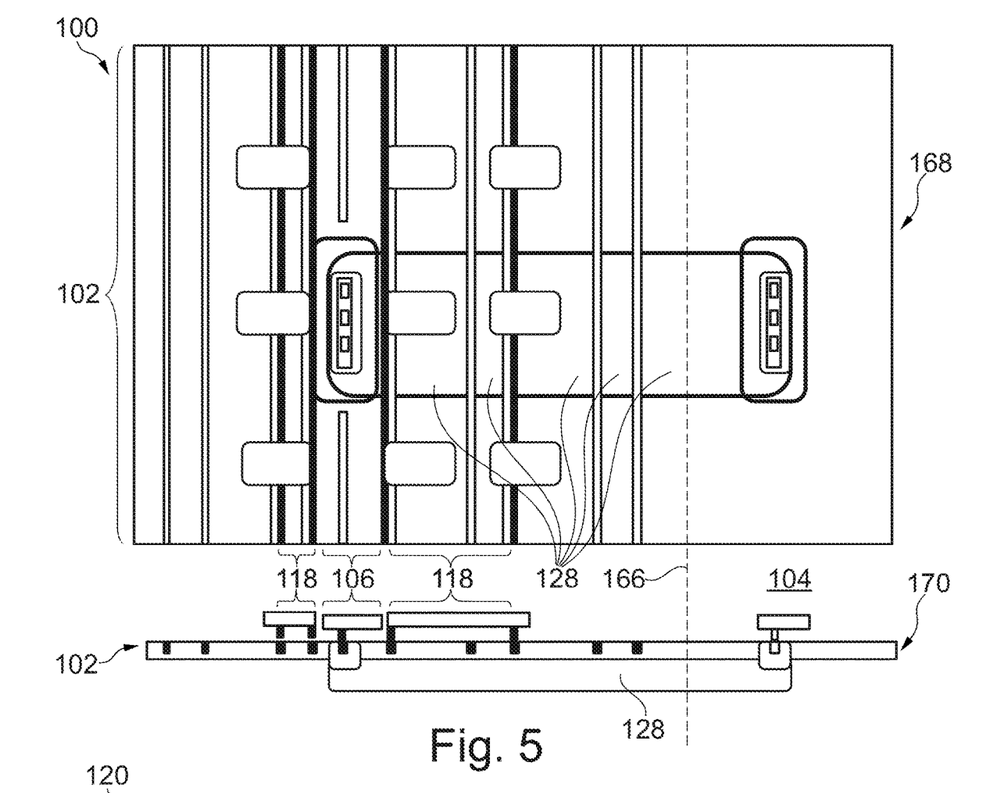
FIG. 5 illustrates a planar view schematic drawing and a cross-sectional view schematic drawing of an edge integrity detection structure embedded in a seal ring of a semiconductor product according to some embodiments.

FIG. 1 illustrates a schematic planar view of a semiconductor product 100 according to an exemplary embodiment. FIG. 2 illustrates a cross-sectional view of a layout implementation of such a semiconductor product 100. FIG. 3 illustrates a cross-sectional view of an edge integrity detection structure 106 of a semiconductor product 100, as the one shown in FIG. 1 and FIG. 2. FIG. 4 illustrates a cross-sectional view of another edge integrity detection structure 106 of a semiconductor product 100, such as the one of FIG. 1 and FIG. 2. FIG. 5 illustrates a planar view and a cross-sectional view of an edge integrity detection structure 106 embedded in a seal ring 118 of a semiconductor product 100 according to an exemplary embodiment which may implement the design of FIG. 2. The seal ring 118 may be a metal-via ring surrounding an integrated circuit 104 of the semiconductor product 100.

Various aspects of exemplary embodiments are described below with reference to FIGS. 1-5.

With reference to FIG. 1, a semiconductor product 100 may comprise a semiconductor chip 102. The semiconductor chip 102 may comprise a semiconductor substrate, such as a silicon substrate. Furthermore, an integrated circuit 104 (only shown schematically) may be formed in and/or on the semiconductor chip 102. In particular, the integrated circuit 104 may be monolithically integrated in the semiconductor chip 102. The integrated circuit 104 may comprise a number of integrated circuit elements, such as at least one of a transistor, a diode, a resistor, a conductive trace, a contacts, a via, a capacitor, or an inductor. Advantageously, the integrated circuit 104 may be formed in a central portion (e.g., away from edges) of the semiconductor chip 102. The integrated circuit 104 may provide or may contribute to a functional application of the semiconductor product 100. For example, the semiconductor product 100 may be configured for providing a Wi-Fi application, a Bluetooth application, a video application, an audio application, a mobile phone application, and/or an automotive application. Many other and/or different functional applications are possible.

Reference sign 140 illustrates a boundary of the semiconductor chip 102. Reference sign 142 shows a place and route boundary (prBoundary). A seal ring 118 of the semiconductor product 100 surrounds the semiconductor chip 102 and its integrated circuit 104. The seal ring 118 may be a metallic structure which protects the semiconductor chip 102 to prevent chipping and cracking. The seal ring 118 may form part of the semiconductor chip 102 or may be arranged to surround the semiconductor chip 102.

An edge integrity detection structure 106 is provided to extend along a major portion of an edge of the semiconductor chip 102. In some embodiments, the edge integrity detection structure 106 may extend along almost the entire perimeter of the semiconductor chip 102 (for above 80 percent (e.g. above 90 percent or 95% of the length of the perimeter). In some embodiments, the edge integrity detection structure 106 extends along the entire perimeter except for a short path between a first terminal 144 and a second terminal 146 of the edge integrity detection structure 106. The edge integrity detection structure 106 allows integrity of an edge of or around the semiconductor chip 102 to be detected using an electric detection of a signal between the first terminal 144 and the second terminal 146, as will be described below in further detail. The actual gap between the two terminals 144 and 146 is in the order of one tenth of a micron or smaller in some embodiments (e.g., for certain modern semiconductor chips). The gap seen on FIG. 1 is not to scale.

In some embodiments, the edge integrity detection structure 106 is integrated in the seal ring 118. With reference to FIG. 2 a first portion 147 of the seal ring 118 is provided at an exterior position from the edge integrity detection structure 106, whereas a second portion 148 of the seal ring 118 is arranged at an interior position from the edge integrity detection structure 106. By integrating the edge integrity detection structure 106 into the seal ring 118, a compact configuration of the semiconductor product 100 may be obtained. First portion 147 of the seal ring 118 is an outer seal ring portion. A gap for creating edge integrity detection structure 106 is between first portion 147 and structure 106 and between second portion 148. Second portion 148 is an inner seal ring portion. A seal ring buffer area is a buffer or transition zone 164 provided on an interior side of second portion 148.

As shown in FIG. 2 and in further detail in FIG. 3 and FIG. 4, the edge integrity detection structure 106 includes a number of electrically connected planar electrically conductive layer structures 108 in some embodiments. In some embodiments, electrically conductive vertical connection elements 110 electrically connect neighboring electrically conductive layer structures 108. The vertical connection elements 110 are conductive (e.g., metallic (e.g., copper, copper alloy, aluminum, aluminum alloy, or other metal)) vias in some embodiments. As seen in FIG. 3 and FIG. 4, more than ten stacked horizontally extending electrically conductive layer structures 108 may be provided, which all overlap with each other almost completely in a plan view. The planar view corresponds to a viewing direction 150 according to FIG. 2, FIG. 3 and FIG. 4. As shown in FIG. 3 and FIG. 4, the electrically conductive layer structures 108, which may be metal layers, are aligned with each other in viewing direction 150. Viewing direction 150 corresponds to a viewing direction onto the paper plane of FIG. 1. With reference to FIG. 3 and FIG. 4, more than 90% of a main surface of each of the electrically conductive layer structures 108 is in alignment with more than 90% of a main surface of each of the other electrically conductive layer structures 108. The only slight deviation from a full alignment of the stacked electrically conductive layer structures 108 occurs in regions of gaps 152 between different sections of a respective electrically conductive layer structure 108 at a certain vertical level. The electrically conductive layer structures 108 are substantially in alignment with each other over their entire extension as shown in FIGS. 3 and 4 in some embodiments. Each of the electrically conductive layer structures 108 may be a planar metal strip shaped as an open rectangle (see FIG. 1)), wherein the layer structures 108 may be stacked so as to be aligned with each other. The strongly overlapping or aligned arrangement of the electrically conductive layer structures 108 at different vertical levels of the edge integrity detection structure 106 has advantages: By almost completely covering a two-dimensional area defining the edge integrity detection structure 106 by the planar parallel electrically conductive layer structures 108 and the vertical connection elements 110, the provided resistor chain is sensitive to potential damages along almost the entire edge of the semiconductor chip 102. If the damage occurs at a respective position of the edge, the continuous resistor chain formed by the layer structures 108 and the vertical connection elements 110 is interrupted, and a strong increase of the resistance of the edge integrity detection structure 106 can be detected by evaluation circuit 120 described below. The metallically dense grid wall-like arrangement of the layer structures 108 and the vertical connection elements 110 according to FIG. 3 and FIG. 4 ensures that there are no blind regions inside of the edge integrity detection structure 106 at which a damage of the semiconductor chip edge would not lead to a detectable change of the resistance, thereby ensuring a high reliability and accuracy of the edge integrity detection in some embodiments With reference to FIG. 3 and FIG. 4, the vertical connection elements 110 can be grouped into a number of groups, wherein electrically conductive vertical connection elements 110 of a respective group are in alignment with each other in planar view corresponding to viewing direction 150. For example, FIG. 3 shows a first group 153 of vertical connection elements 110 aligned along viewing direction 150 corresponding to the plan view. Furthermore, a second group 154 of vertical connection elements 110 being mutually aligned with respect to viewing direction 150 corresponding to the plan view is shown as well. Still referring to FIG. 3 and FIG. 4, the vertical connection elements 110 can be arranged as electrically conductive vertical bridges for connecting respective sections of two vertically adjacent layer structures 108. As a result, the interconnected layer structures 108 and vertical connection elements 110 form a meandering resistor chain in some embodiments. For this purpose, each of the vertical connection elements 110 may be located at a respective lateral end of an assigned section of a respective layer structure 108.

With reference to FIG. 3 and FIG. 4, the electrically conductive layer structures 108 and the electrically conductive vertical connection elements 110 form a meander structure 112 and a further meander structure 114. As shown, the meander structure 112 and the further meander structure 114 are electrically connected with each other at a bottom side. Moreover, the meander structure 112 and the further meander structure 114 are interleaved (as indicated schematically with reference sign 190), to further reduce the size of non-metallic regions inside of the edge integrity detection resistor chain. With reference to FIG. 3, a stack of layer structures 108 has a first lateral side 109A and a second lateral side 109B. Each layer structure 108 on the left side of FIG. 2 includes an end 111A associated with first lateral side 109A and an end 111B associated with second lateral side 109b.

As shown in FIG. 4, it is also possible that the edge integrity detection structure 106 comprises additional other meander structures 116, 117 arranged side-by-side with the meander structure 112 and with the further meander structure 114, and being interconnected and interleaved in a corresponding way. The structures shown in FIG. 3 and FIG. 4 can be spatially extended so as to surround almost the entire semiconductor chip or product 100, as shown in FIG. 1.

FIG. 3 and FIG. 4 each show a unit cell of an edge integrity detection structure 106 configured as edge detection monitor ring. The illustrated configuration has the advantage of a coverage of each metal layer or edge integrity detection structure 106 being close to 100%. The vertical connection elements 110, illustrated as vertical bars, may be conductive vias between the horizontal metal layer structures 108. According to FIG. 3 and FIG. 4, every layer structure 108 covers almost the full length of the illustrated region with metallic sensor or probe material. Due to such a full coverage with metal, there is a high probability of detecting any kind of damage, regardless where it occurs.

Due to their mutual interconnection, the layer structures 108 and the vertical connection elements 110 may form a continuously connected resistor chain between the first terminal 144 and the second terminal 146 (FIG. 1). Consequently, the edge integrity detection structure 106 may be configured so that the electrically conductive layer structures 108 and the electrically conductive vertical connection elements 110 may be disconnected from each other in the event of a breakage and/or a delamination at the edge of the semiconductor chip 102. In the event of a breakage, the resistor chain may be interrupted at a layer structure 108 where the breakage occurs. In the event of a delamination, an interconnection of two adjacent layer structures 108 by a vertical connection element 110 in between may be interrupted. Such events may cause an increase of the resistance between terminals 144, 146 which can be measured by evaluation circuit 120. Evaluation circuit 120 may also be denoted as a sensor circuit.

As discussed above, the edge integrity detection structure 106 may be configured as a two terminal resistor chain connected to evaluation circuit 120. The layer structures 108 and the vertical connection elements 110 form a resistor chain between the first terminal 144 and the second terminal 146. The two terminal resistor chain can be connected between the first terminal 144, constituting a lower supply voltage terminal VSS_SR_EDM (such as a ground terminal), and the second terminal 146 functioning as a sense terminal SR_EDM_i. Moreover, the sense terminal SR_EDM_i may be coupled via a pull-up resistor 156 of a pull-up circuitry to a supply voltage VDD_SR_EDM.

The denotations VSS_SR_EDM, VDD_SR_EDM, SR_EDM_i, SR_EDM_o are defined as follows: "VSS" indicates a lower supply potential (such as ground), "VDD" indicates a higher supply potential (for providing electric operation energy), "SR" indicates a reference to seal ring 118, "EDM" relates to an edge damage monitor ring (corresponding to edge integrity detection structure 106), "i" denotes input, and "o" denotes output.

Still referring to FIG. 1, evaluation circuit 120 may be electrically connected with the edge integrity detection structure 106 via the first terminal 144 and the second terminal 146. In some embodiments, evaluation circuit 120 comprises a logic block 158 which is configured for evaluating a resistance of the edge integrity detection structure 106 for providing an evaluation signal at an output terminal SR_EDM_o indicative of a detected edge integrity status of the edge of the semiconductor chip 102.

Advantageously, the evaluation circuit 120 may be monolithically integrated in the semiconductor chip 102. The evaluation circuit 120 may be formed in and/or on the semiconductor chip 102 in some embodiments. This may keep the dimensions of the semiconductor product 100 small. Furthermore, short connection paths between edge integrity detection structure 106 and evaluation circuit 120 may then be ensured, which may have a positive impact on quality and integrity of the evaluation signal. Furthermore, the evaluation circuit 120 forms part of or is electrically connected with the integrated circuit 104. Thus, the evaluation signal may be transported to the integrated circuit 104 so that it can be provided for further processing during a chip test or the like. Monolithically integrating the evaluation circuit 120 also into the semiconductor chip 102 may also contribute to a miniature or smaller design.

According to FIG. 1, the evaluation circuit 120 is arranged at an edge of the integrated circuit 104 neighboring to the seal ring 118 on a left-hand side of the semiconductor chip 102. However, it is alternatively possible that the evaluation circuit 120 is located on a right-hand side, on a top side and/or on a bottom side of the semiconductor chip 102. Hence, the circuitry according to FIG. 1 can be freely designed.

As already mentioned, the evaluation circuit 120 may be electrically connected with the edge integrity detection structure 106. Furthermore, evaluation circuit 120 may be configured for evaluating an electric characteristic of the edge integrity detection structure 106 for providing an evaluation signal indicative of a detected edge integrity status of the edge of the semiconductor chip 102. More specifically, the evaluation circuit 120 may be configured for evaluating a resistance of the edge integrity detection structure 106 as basis for the evaluation signal. For example, evaluation of the resistance may be accomplished by detecting a current flowing through the edge integrity detection structure 106. For instance, a zero current may be indicative of a defective detected edge integrity status, since an interruption of the resistor chain formed by the layer structures 108 and the vertical connection elements 110 may increase the resistance to an extremely high value. Furthermore, a non-zero current flowing along edge integrity detection structure 106 may be indicative of an intact detected edge integrity status, since a current may flow only along an intact resistor chain.

Advantageously, the evaluation circuit 120 of FIG. 1 can be configured for providing a logic evaluation signal indicative of the detected edge integrity status and supplied at terminal SR_EDM_o. The logic or digital evaluation signal is preferably a one-bit signal indicating by a logic value "0" or "1" whether or not the edge integrity detection structure 106, and consequently the edge of the semiconductor chip 102, is intact or not. In order to create such a logic digital evaluation signal, the evaluation circuit 120 may comprise an analog block for detecting information indicative of a resistance of the edge integrity detection structure 106. Furthermore, the evaluation circuit 120 may be configured for providing, at terminal SR_EDM_o, the digital evaluation signal indicative of the detected edge integrity status. The terminal SR_EDM_o may function as an electric output interface configured for providing the evaluation signal to an external automatic test equipment (not shown). For instance, the evaluation circuit 120 may provide the evaluation signal in the framework of a semiconductor product test procedure.

Evaluation circuit 120 can be any hardware circuit or software process for detecting structure integrity. In some embodiments, evaluation circuit 120 is processor, microcontroller (e.g., executing firmware), an ASIC, a field programmable gate array (FPGA) or logic device, or any other type and form of dedicated semiconductor logic or processing circuitry capable of processing or supporting the operations described herein With reference to FIG. 2 and FIG. 5, the evaluation circuit 120 is electrically connected with the edge integrity detection structure 106 by an electrically conductive connection structure 128 which is buried within the semiconductor chip 102 and extends below the edge integrity detection structure 106 and below the interior part 148 of the seal ring 118. According to the described embodiment, the seal ring 118 of the semiconductor product 100 surrounds the integrated circuit 104 and has the edge integrity detection structure 106 integrated therein. The buried connection structure 128 extends in an interior of the semiconductor chip 102 beneath the seal ring 118 and the edge integrity detection structure 106 and electrically connects the edge integrity detection structure 106 with the evaluation circuit 120. A deep n-well connection may be used as buried connection structure 128 to connect SR_EDM_i to the sensor block. By taking this measure, a sense signal may be supplied as an input to the on-chip evaluation circuit 120 through the buried connection structure 128. The sense signal may be transported at a semiconductor level below the metallic level. Advantageously, the function of the seal ring 118 is not negatively influenced by the function of the edge integrity detection structure 106, and the integrity of the seal ring 118 may be maintained. In contrast to this, the lower potential VSS may be connected to the edge integrity detection structure 106 via the seal ring 118, which may be a grounded metal ring. Furthermore, a buffer or transition zone 164 may be disposed between the seal ring 118 and the integrated circuit 104, (e.g., chip boundary 166). Also FIG. 5 illustrates the buried connection line or structure 128, both in a top view 168 and a cross-sectional view 170.

Again referring to FIG. 1, the illustrated seal ring monitor includes a continuous metal-via chain as edge damage monitor ring or edge integrity detection structure 106. The latter may be embedded in the seal ring 118. One end of the resistor chain of the edge integrity detection structure 106 (e.g., the second terminal 146) may be tied to a sense input of the evaluation circuit 120. The other end (e.g., the first terminal 144) may be connected to the chip core, and hence to the lower potential VSS. The output SR_EDM_o may be at a high level or a logic value "1" when the seal ring monitor chain is broken, i.e. when there is a damage to the seal ring 118. Otherwise, the output SR_EDM_o may be at a low level or a logic value "0".

Three pins may be connected to the main chip in some embodiments. These pins are a core level logic output pin corresponding to SR_EDM_o, and two core supply pins corresponding to VDD_SR_EDM and VSS_SR_EDM in some embodiments.

In some embodiments, a test method for testing integrity of the chip edge at or next to seal ring 118 can be carried out. For this purpose, it may be possible to create an analog block or circuit to detect the chain resistance and to output a one-bit digital signal to the main chip. The analog block can have inputs of the chip's I/O and to core supply VDD. The output can be used in the main chip's power on test logic to report the results: a logic value "1" may indicate a failure in the seal ring monitor, and a logic value "0" may indicate a pass. The analog block may have a comparator, bias circuits and a level shifter.

Figure 6:
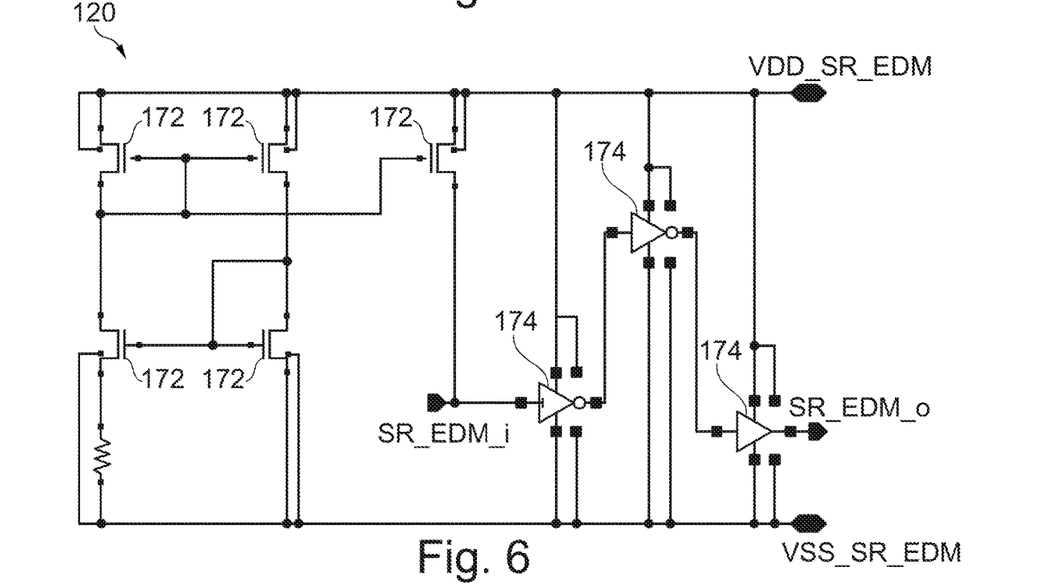
FIG. 6 illustrates an electrical schematic drawing of evaluation circuitry of a semiconductor product according to some embodiments.

FIG. 6 illustrates an evaluation circuit 120 of a semiconductor product 100 according to an exemplary embodiment. FIG. 6 also shows the various above-mentioned terminals and provides an example for realizing evaluation circuit 120 at the level of transistors 172 and logic gates 174.

Figure 7:
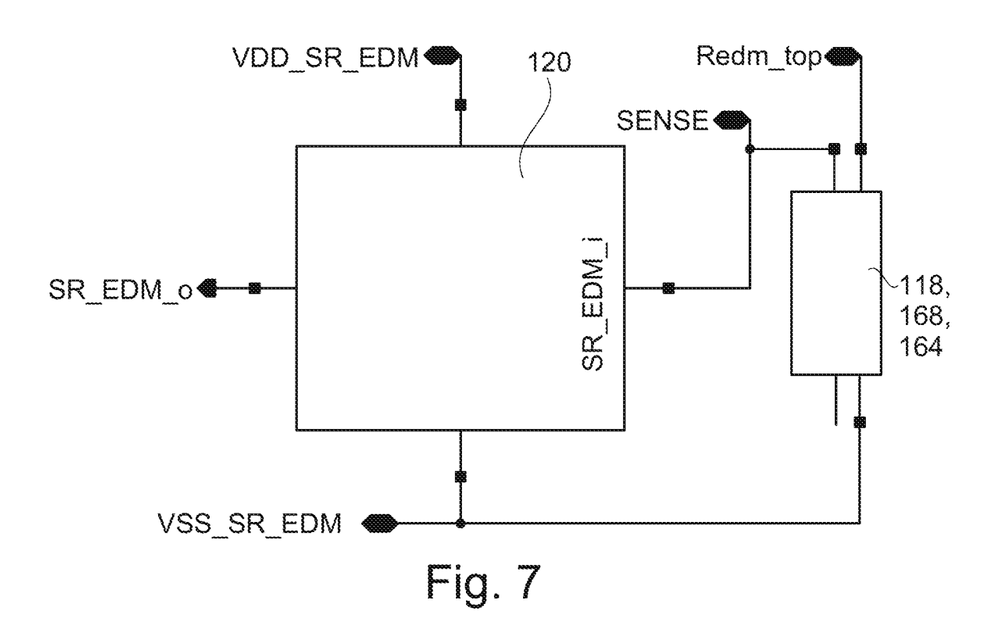
FIG. 7 illustrates an electrical schematic drawing of evaluation circuitry of a semiconductor product according to some embodiments.

FIG. 7 illustrates an evaluation circuit 120 of a semiconductor product 100 according to an exemplary embodiment. More specifically, FIG. 7 shows an example of the connection between a seal ring 118 and an evaluation circuit 120. A sense terminal denoted SENSE is shown as well. During operation, a terminal Redm_top is left floating in some embodiments. In some embodiments, VDD_SR_EDM and VSS_SR_EDM are connected to the core potentials VDD and VSS, respectively. In some embodiments, SR_EDM_o is connected to a chip internal register or multiplexer for carrying out a test, such as an ATE and bench test.

Figure 8:
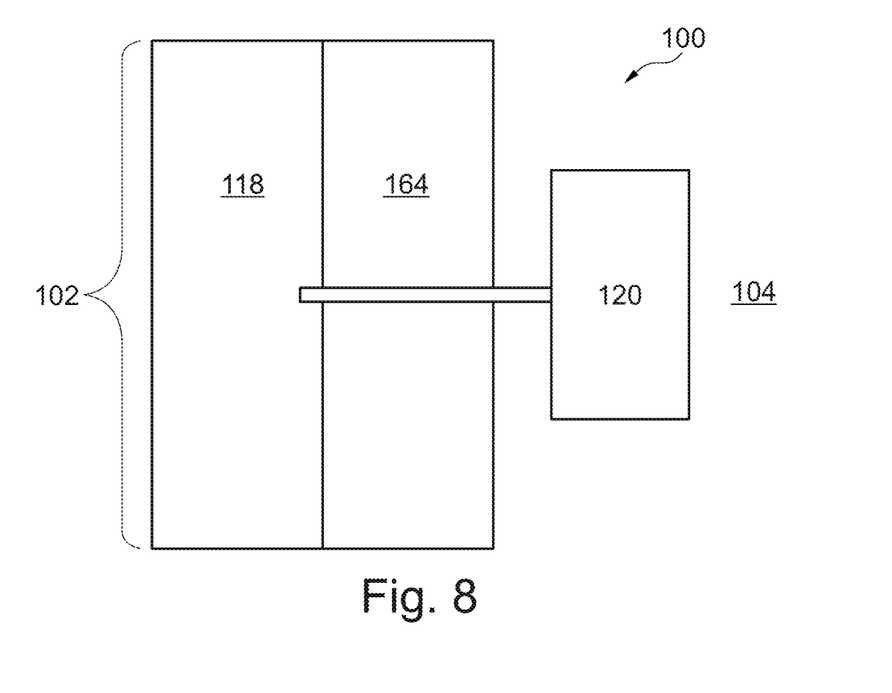
FIG. 8 illustrates a planar view schematic drawing of a portion of a semiconductor product according to some embodiments.

FIG. 8 illustrates another planar view of a portion of a semiconductor product 100 according to an exemplary embodiment.

A sensor block or circuit of evaluation circuit 120 connects to the seal ring 118 by overlapping abutment in some embodiments. For example, the sensor block may have four pins: SR_EDM_i (input), SR_EDM_o (output, core level digital signal), VDD (in/out, core VDD) and VSS (in/out, core VSS). The three last mentioned pins may be connected to the chip core. The SR_EDM_i may be left open in the chip 102. Internal to the sensor block, SR_EDM_i has a weak pull up. SR_EDM_i may connect to one end of seal ring resistor by abutment. The other end of the ring metal-via resistor may be connected to VSS by abutment.

Figure 9:
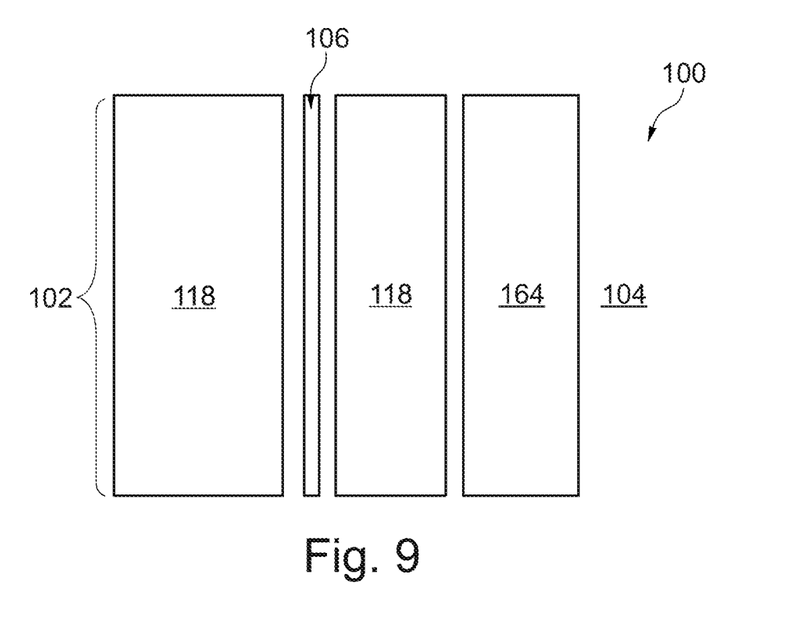
FIG. 9 illustrates a planar view schematic drawing of a portion of a semiconductor product according to some embodiments.

FIG. 9 illustrates a planar view or top view of a portion of a semiconductor product 100 according to an exemplary embodiment.

Embedded in a seal ring 118, a continuous metal-via stacked ring may be used as edge integrity detection structure 106 to detect the integrity of the seal ring 118. A sensor may be placed over a tab on the right or left side of the main chip.

Figure 10:
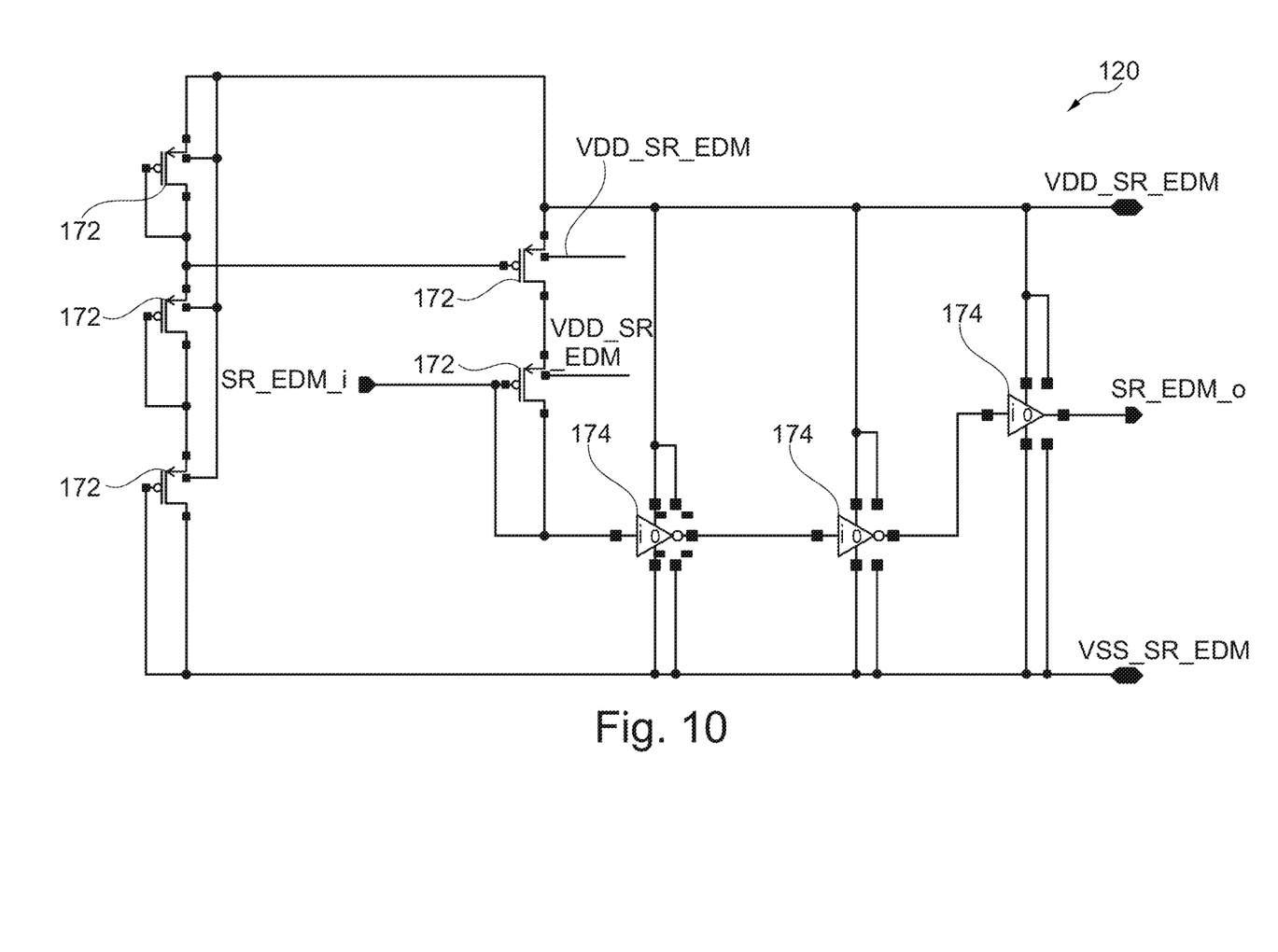
FIG. 10 illustrates an electrical schematic drawing of an evaluation circuitry of a semiconductor product according to some embodiments.

FIG. 10 illustrates an evaluation circuit 120 of a semiconductor product 100 according to some embodiments. FIG. 10 shows a core logic implementation with analog resistor to logic signal converter. FIG. 10 also shows the various above-mentioned terminals and provides evaluation circuit 120 at the level of transistors 172 and logic gates 174 in some embodiments.

Figure 11:
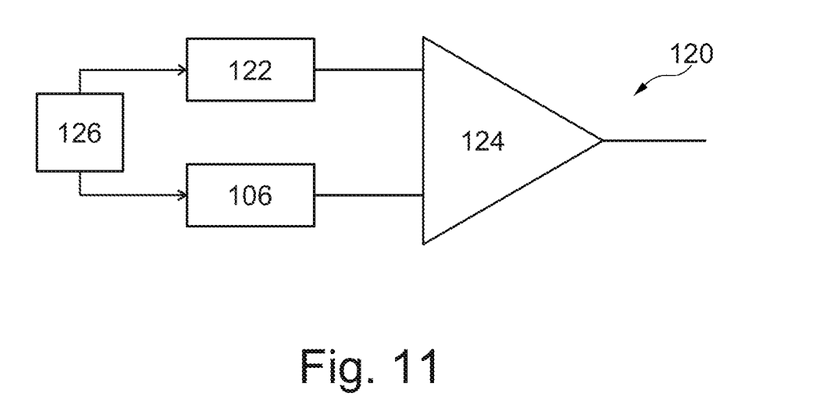
FIG. 11 illustrates an electrical schematic drawing of an evaluation circuitry of a semiconductor product according to some embodiments.

FIG. 11 illustrates an evaluation circuit 120 of a semiconductor product 100 according to some embodiments.

The illustrated evaluation circuit 120 comprises a reference resistance structure 122 having a higher resistance value than the edge integrity detection structure 106 in an intact state of the edge integrity detection structure 106. The evaluation circuit 120 includes a comparator circuit 124. Comparator circuit 124 is configured for comparing a signal indicative of the resistance value of the edge integrity detection structure 106 with a signal indicative of the resistance value of the reference resistance structure 122. As a result, the evaluation signal provided by comparator circuit 124 may be provided as an output of the comparator circuit 124. In some embodiments, the evaluation circuit 120 includes bias circuitry 126 for electrically biasing the edge integrity detection structure 106 and the reference resistance structure 122.

Many modifications of the described embodiments are possible. For example: According to the drawings, the VSS_SR_EDM connection may extend through the seal ring structure. In particular in the case that the inner seal ring is not tied to VSS, it is also possible to connect the VSS end of the meander structure with a second connection described in FIG. 5. Connecting both ends of the meander structure through the connection described in FIG. 5 may be made without breaking the inner seal ring. In some embodiments, the well/deep well are p-type wells.

It should be noted that certain passages of this disclosure may reference terms such as "first" and "second" in connection with devices, mode of operation, transmit chains, etc., for purposes of identifying or differentiating one from another or from others. These terms are not intended to merely relate entities (for instance, a first device and a second device) temporally or according to a sequence, although in some cases, these entities may include such a relationship. Nor do these terms limit the number of possible entities (for instance, devices) that may operate within a system or environment.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

Having now described some illustrative embodiments, it is apparent that the foregoing is illustrative and not limiting, having been presented by way of example. In particular, although many of the examples presented herein involve specific combinations of method acts or system elements, those acts and those elements can be combined in other ways to accomplish the same objectives. Acts, elements and features discussed only in connection with one implementation are not intended to be excluded from a similar role in other embodiments or embodiments.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate embodiments comprising the items listed thereafter exclusively. In one implementation, the systems and methods described herein consist of one, each combination of more than one, or all of the described elements, acts, or components.

Any references to embodiments or elements or acts of the systems and methods herein referred to in the singular can also embrace embodiments including a plurality of these elements, and any references in plural to any implementation or element or act herein can also embrace embodiments including only a single element. References in the singular or plural form are not intended to limit the presently disclosed systems or methods, their components, acts, or elements to single or plural configurations. References to any act or element being based on any information, act or element can include embodiments where the act or element is based at least in part on any information, act, or element.

Any implementation disclosed herein can be combined with any other implementation, and references to "an implementation," "some embodiments," "an alternate implementation," "various implementation," "one implementation" or the like are not necessarily mutually exclusive and are intended to indicate that a particular feature, structure, or characteristic described in connection with the implementation can be included in at least one implementation. Such terms as used herein are not necessarily all referring to the same implementation. Any implementation can be combined with any other implementation, inclusively or exclusively, in any manner consistent with the aspects and embodiments disclosed herein.

References to "or" can be construed as inclusive so that any terms described using "or" can indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The systems and methods described herein can be embodied in other specific forms without departing from the characteristics thereof. The foregoing embodiments are illustrative rather than limiting of the described systems and methods. The scope of the systems and methods described herein can thus be indicated by the appended claims, rather than the foregoing description, and changes that come within the meaning and range of equivalency of the claims are embraced therein.

We claim:

1. A semiconductor product, comprising:
    a semiconductor chip;
    an edge integrity detection structure extending along at least part of an edge of the semiconductor chip,
    the edge integrity detection structure comprising a stack of conductive layers, wherein the stack has first lateral side and a second lateral side opposite the first lateral side,
    wherein a first layer of the conductive layers extends from a first end of the first layer associated with the first lateral side to a second end of the first layer associated with the second lateral side and is coupled to a second layer of the stack by a first vertical connection element at the first end of the first layer of the stack,
    wherein the second layer extends from a first end of the second layer associated with the first lateral side to a second end of the second layer associated with the second lateral side,
    wherein a third layer of the conductive layers extends from a first end of the third layer associated with the first lateral side to a second end of the third layer associated with the second lateral side and is coupled to the second layer of the stack by a second vertical connection element at the second end of the third layer of the stack,
    wherein a fourth layer of the conductive layers extends from a first end of the fourth layer associated with the first lateral side to a second end of the fourth layer associated with the second lateral side and is coupled to the third layer of the stack by a third vertical connection element at the first end of the fourth layer of the stack,
    wherein the second layer is not coupled to the third layer at the first end of the third layer,
    wherein the first end of the first layer is opposite the second end of the first layer, the first end of the second layer is opposite the second end of the second layer, the first end of the third layer is opposite the second end of the third layer and the first end of the fourth layer is opposite the second end of the fourth layer; and
    circuitry formed in and/or on the semiconductor chip, being electrically connected with the edge integrity detection structure, and being configured to evaluate an electric characteristic of the edge integrity detection structure to provide a signal indicative of an integrity status of the edge.

2. The semiconductor product according to claim 1, wherein the circuitry forms part of and/or is electrically connected with an integrated circuit formed in and/or on the semiconductor chip.

3. The semiconductor product according to claim 2, wherein the circuitry is arranged at an edge of the integrated circuit neighboring to at least part of a seal ring.

4. The semiconductor product according to claim 1, wherein the circuitry is configured to provide the signal indicative of the integrity status as an on-chip signal.

5. The semiconductor product according to claim 1, wherein the circuitry comprises an analog block configured to detect information indicative of a resistance of the edge integrity detection structure, and is configured to provide the signal indicative of the integrity status as a digital evaluation signal.

6. The semiconductor product according to claim 5, wherein the digital evaluation signal is a one-bit signal.

7. The semiconductor product according to claim 1, wherein the circuitry is configured to provide an evaluation signal in a semiconductor product test procedure.

8. The semiconductor product according to claim 1, further comprising:

a seal ring surrounding an integrated circuit formed in and/or on the semiconductor chip and having at least part of the edge integrity detection structure integrated therein; and a buried connection structure extending in the semiconductor chip beneath the seal ring and beneath the edge integrity detection structure and electrically connecting the edge integrity detection structure with the circuitry.

9. A semiconductor product, comprising:
a semiconductor chip;
an integrated circuit formed in and/or on the semiconductor chip; and
an edge structure extending along at least part of an edge of the semiconductor chip and comprising a plurality of parallel planar electrically conductive layers,
the edge structure comprising a first section of first conductive layers extending from a first side to a second side opposite the first side and a second section of second conductive layers extending from a third side to a fourth side opposite the third side,
wherein the second side and the third side are between the first side and the fourth side,
wherein the first section and the second section are interstitially disposed with respect to each other such that a first conductive layer and a second conductive layer of the first conductive layers in the first section overlaps a third conductive layer and a fourth conductive layer of the second conductive layers in the second section along a vertical line through the first conductive layers and the second conductive layers at a location associated with the second side and the third side,
wherein second ends of the third conductive layer in the second section and fourth conductive layer in the second section at the third side are between first ends of the first conductive layer in the first section and the second conductive layer of the first section at the second side.

10. The semiconductor product according to claim 9, further comprising a seal ring surrounding at least part of the integrated circuit, wherein at least part of the edge structure is integrated in the seal ring.

11. The semiconductor product according to claim 9, wherein the edge structure is configured as a two terminal resistor chain.

12. The semiconductor product according to claim 9, further comprising circuitry being electrically connected or connectable with the edge structure, and being configured to evaluate a resistance of the edge structure to provide an evaluation signal indicative of a detected edge integrity status of the edge.

13. The semiconductor product according to claim 9,
wherein the first conductive layer and another conductive layer of the first conductive layers in the first section are coupled by a first vertical element at a first end of the first conductive layer and the another conductive layer of the first conductive layers in the first section, and
the third conductive layer and the fourth conductive layer of the second conductive layers in the second section are coupled by a second vertical element at the second ends between the first conductive layer and the second conductive layer of the first conductive layers.

14. The semiconductor product according to claim 12, wherein the circuitry is electrically connected with the edge structure by a connection structure which is buried within the semiconductor chip and extends below the edge structure.

15. A semiconductor product, comprising:
a semiconductor chip;
an integrated circuit formed in and/or on the semiconductor chip; and
an edge integrity detection structure extending along at least part of an edge of the semiconductor chip and comprising a plurality of electrically connected planar electrically conductive layer structures, wherein the electrically conductive layer structures have a first side and a second side opposite the first side and comprise a stack of a first layer, a second layer and a third layer, wherein the first layer, the second layer and the third layer each overlaps at least partially with each other in a planar view, wherein a current path is provided from the first layer at the first side to a second side of the first layer, through a first vertical connection element at the second side to the second layer, from the second layer at the second side to the first side on the second layer, through a second vertical connection element at the first side to the third layer at first side, and from the third layer at the first side to the second side on the third layer, wherein the integrated circuit is configured to provide current for travel along the current path, wherein a vertical line parallel to the current path at the first vertical connection element and through the first vertical connection element at the second side extends through all of the first layer, the second layer, and the third layer.

16. The semiconductor product according to claim 15, wherein at least 80% of a main surface of each of a first set of the electrically conductive layer structures is in alignment with at least 80% of a main surface of each of a second set of the electrically conductive layer structures.

17. The semiconductor product according to claim 15, wherein the current path is provided from the third layer at the second side through a third vertical connection element at the second side to a fourth layer, to the first side of the fourth layer and through a fourth vertical connection element at the first side to a fifth layer, wherein the second and fourth vertical connection elements are aligned vertically and the first and third vertical connection elements are not aligned vertically.

18. The semiconductor product according to claim 17, wherein the electrically conductive layer structures form a meander structure.

19. The semiconductor product according to claim 18, wherein the electrically conductive layer structures additionally form a further meander structure.

20. The semiconductor product according to claim 19, wherein the meander structure and the further meander structure are interleaved.

* * * * *